United States Patent
Capote et al.

(10) Patent No.: US 6,297,560 B1
(45) Date of Patent: *Oct. 2, 2001

(54) SEMICONDUCTOR FLIP-CHIP ASSEMBLY WITH PRE-APPLIED ENCAPSULATING LAYERS

(75) Inventors: Miguel A. Capote, Carlsbad; Xiaoqi Zhu, Vista, both of CA (US)

(73) Assignee: Miguel Albert Capote, Carlsbad, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/137,971

(22) Filed: Aug. 21, 1998

Related U.S. Application Data

(63) Continuation of application No. 09/120,172, filed on Jul. 21, 1998, now Pat. No. 6,121,689, which is a continuation of application No. 08/962,159, filed on Oct. 31, 1997, now Pat. No. 5,985,043, which is a continuation of application No. 08/897,968, filed on Jul. 21, 1997, now Pat. No. 5,985,043

(60) Provisional application No. 60/056,043, filed on Sep. 2, 1997, provisional application No. 60/053,407, filed on Jul. 21, 1997, and provisional application No. 60/028,796, filed on Oct. 31, 1996.

(51) Int. Cl.[7] ................................................. H01L 23/48
(52) U.S. Cl. .......................... 257/778; 257/701; 257/773; 257/777; 257/779; 257/780; 257/782; 257/783; 257/785; 257/786; 257/789; 257/795
(58) Field of Search .................................. 257/778, 777, 257/780, 782, 786, 773, 701, 779, 783, 785, 789, 795

(56) References Cited

U.S. PATENT DOCUMENTS

| 5,349,240 | * | 9/1994 | Narita et al. | 257/791 |
| 5,629,566 | * | 5/1997 | Doi et al. | 257/789 |
| 5,704,116 | * | 1/1998 | Gamota et al. | 29/840 |
| 5,710,071 | * | 1/1998 | Beddingfield et al. | 438/108 |
| 5,742,100 | | 4/1998 | Schroeder et al. . | |
| 5,751,068 | | 5/1998 | McMachon et al. . | |
| 5,770,476 | | 6/1998 | Stone . | |
| 5,801,072 | | 9/1998 | Barber . | |
| 5,801,449 | * | 9/1998 | Dehaine et al. | 257/780 |
| 5,849,608 | | 12/1998 | Abe . | |
| 5,861,323 | * | 1/1999 | Hayes | 438/111 |

\* cited by examiner

Primary Examiner—Eddie Lee
Assistant Examiner—Matthew E. Warren
(74) Attorney, Agent, or Firm—Burns, Doane, Swecker & Mathis, L.L.P.

(57) ABSTRACT

A simplified process for flip-chip attachment of a chip to a substrate is provided by pre-coating the chip with an encapsulant underfill material having separate discrete solder columns therein to eliminate the conventional capillary flow underfill process. There is also provided a flip-chip configuration having a flexible tape lamination for underfill encapsulation. With this configuration, the complaint solder/flexible encapsulant understructure absorbs the strain caused by the difference in the thermal coefficients of expansion between the chip and the substrate and provides enhanced ruggedness.

35 Claims, 3 Drawing Sheets

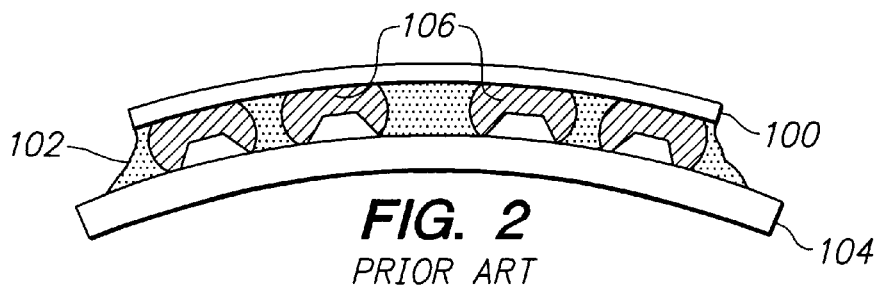
FIG. 1
PRIOR ART
FIG. 2
PRIOR ART
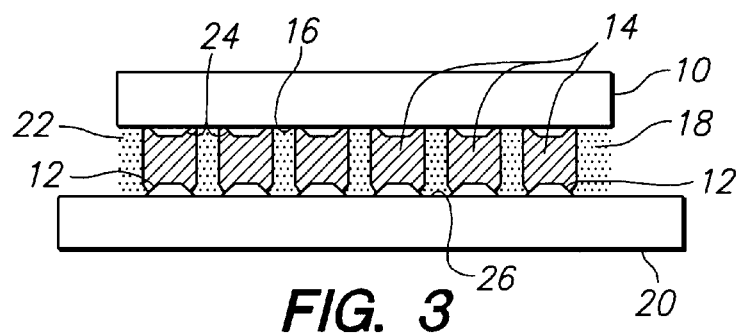
FIG. 3
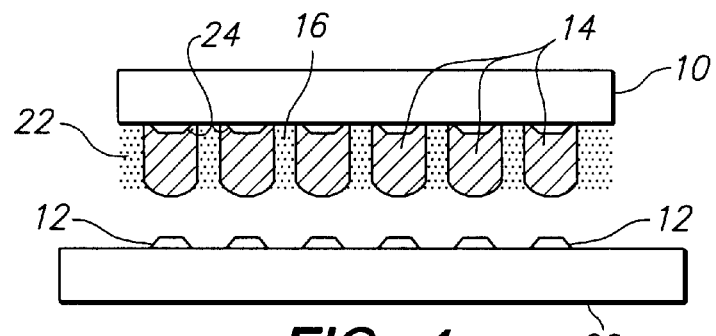
FIG. 4

SEMICONDUCTOR FLIP-CHIP ASSEMBLY WITH PRE-APPLIED ENCAPSULATING LAYERS

This application claims benefits to U.S. provisional application 60/056,043 filed Sep. 2, 1997 which is a continuation of Ser. No. 09/120,172 filed Jul. 21, 1998 now U.S. Pat. No. 6,121,689 which claims benefit to U.S. provisional application 60/053,407 filed Jul. 12, 1997 which is a continuation of Ser. No. 08/897,968 filed Jul. 12, 1997 now U.S. Pat. No. 5,985,043 which is a continuation of Ser. No. 08/962,159 filed Oct. 31, 1997 now U.S. Pat. No. 5,949,138 which claims benefit to U.S. provisional application 60/028,796 filed Oct. 31, 1996.

The U.S. Government has a paid-up license in this invention and the right in limited circumstances to require the patent owner to license others on reasonable terms as provided for by the terms of contract no. N00164-96-C-0089 awarded by Defense Advanced Research Projects Agency.

FIELD OF THE INVENTION

This invention relates generally to semiconductor chips electrically and mechanically connected to a substrate, particularly to flip-chip configurations.

BACKGROUND OF THE INVENTION

Flip-chip technology is well known in the art. A semiconductor chip having solder bumps formed on the active side of the semi-conductor chip is inverted and bonded to a substrate through the solder bumps by reflowing the solder. Structural solder joints are formed between the semiconductor chip and the substrate to form the mechanical and electrical connections between the chip and substrate. A narrow gap is left between the semi-conductor chip and the substrate.

One obstacle to flip-chip technology when applied to polymer printed circuits is the unacceptably poor reliability of the solder joints due to the mismatch of the coefficients of thermal expansion between the chip, having a coefficient of thermal expansion of about 3 PPM/° C., and the polymer substrate, e.g. epoxy-glass having a coefficient of thermal expansion of about 16 to 26 PPM/° C., which causes stress build up in the solder joints. Because the structural solder joints are small, they are thus subject to failures. In the past, the solder joint integrity of flip-chip interconnects to a substrate has been enhanced by underfilling the volume between the chip and the substrate with an underfill encapsulant material comprised of a suitable polymer. The underfill material is typically dispensed around two adjacent sides of the semiconductor chip, then the underfill material slowly flows by capillary action to fill the gap between the chip and the substrate. The underfill material is then hardened by baking for an extended period. For the underfill encapsulant to be effective, it is important that it adhere well to the chip and the substrate to improve the solder joint integrity. Underfilling the chip with a subsequently cured encapsulant has been shown to reduce solder joint cracking caused by thermal expansion mismatch between the chip and the substrate. The cured encapsulant reduces the stresses, induced by differential expansion and contraction, on the solder joints.

The underfill process, however, makes the assembly of encapsulated flip-chip printed wire boards (PWB) a time consuming, labor intensive and expensive process with a number of uncertainties. To join the integrated circuit to the substrate, a flux, generally a no-clean, low residue flux, is placed on the chip or substrate. Then the integrated circuit is placed on the substrate. The assembly is subjected to a solder reflowing thermal cycle, soldering the chip to the substrate. The surface tension of the solder aids to self align the chip to the substrate terminals. After reflow, due to the close proximity of the chip to the substrate, removing flux residues from under the chip is such a difficult operation that it is generally not done. Therefore the flux residues are generally left in the space between the chip and the substrate. These residues are known to reduce the reliability and integrity of the encapsulant.

After reflow, underfill encapsulation of the chip generally follows. In the prior art, the polymers of choice for the underfill encapsulation have been epoxies, the coefficient of thermal expansion and moduli of the epoxies being adjusted with the addition of inorganic fillers. To achieve optimum reliability, a coefficient of thermal expansion in the vicinity of 25 PPM/° C. is preferred and a modulus of 4 GPa or more. Since the preferred epoxies have coefficient of thermal expansions exceeding 80 PPM/° C. and moduli of less than 4 GPa, the inorganic fillers selected generally have much lower coefficient of thermal expansions and much higher moduli so that in the aggregate, the epoxy-inorganic mixture is within the desired range.

The underfill encapsulation technique of the prior art has four principal disadvantages:

1. The reflowing of the solder bump and then underfilling and curing the encapsulant is a multi-step process that results in reduced production efficiency;
2. To underfill a flip-chip assembly takes too long because the material must flow through the tiny gap between the chip and the substrate;
3. The flux residues remaining in the gap reduce the adhesive and cohesive strengths of the underfill encapsulating adhesive, affecting the reliability of the assembly; and
4. As the size of chips increase, the limiting effect of capillary action becomes more critical and makes the encapsulation procedure more time consuming, more susceptible to void formation and to the separation of the polymer from the fillers during application.

Clearly, many improvements to this process are feasible to increase reliability, reduce the time required and decrease the likelihood of producing a void in the encapsulant while providing the required low coefficient of thermal expansion and high modulus.

Other prior art methods of encapsulating the chip have attempted to overcome the above limitations by applying the encapsulating resin through a hole in the substrate located near the center of the chip. After the soldering and cleaning operations, the encapsulating resin is forced through the hole and around the periphery of the chip to ensure complete coverage of the chip surface. This method suffers from the need to reserve an area in the center of the substrate that is free of circuitry in order to provide an unused space for the hole. It also does not eliminate the problems of entrapped air bubbles.

Another prior art method in U.S. Pat. No. 5,128,746 (Pennisi) teaches a method wherein an adhesive material including a fluxing agent is applied to the chip or substrate. The chip is positioned on the substrate and the solder bumps are reflowed. During the reflow step, the fluxing agent promotes wetting of the solder to the substrate metallization pattern and the adhesive material is cured, mechanically interconnecting and encapsulating the substrate to the component. The limitation of this technique is that in order for the molten solder to readily wet the substrate metallization and also to allow the solder, through surface tension, to self-align the chip bumps to the substrate metallization pattern, the material must maintain very low viscosity during the reflow step. But the viscosity of these materials is severely increased by the presence of the required inorganic fillers. As a result, this approach has failed to produce a material that can serve as both the flux and the encapsulant with the required low coefficient of thermal expansion and high modulus for optimum reliability.

Referring to FIGS. 1 and 2, underfilling the chip 100 with a subsequently hardened encapsulant 102 has been shown to reduce solder joint cracking caused by thermal expansion mismatch between the chip and the substrate 104. The hardened encapsulant 102 transfers the stresses, induced by differential expansion and contraction, from the solder joints 106 to deformation of the chip 100 and substrate 104 as shown in FIG. 1 for expansion-induced strain at elevated temperatures and FIG. 2 for contraction-induced strain at reduced temperatures. In other words, the main effect of the hardened encapsulant during thermal expansion or contraction is to effectively force the chip and the substrate to take up the stress caused by the coefficients of thermal expansion mismatch by bending and bulging the chip and substrate. This bending and bulging reduces the stress on the solder joints and virtually eliminates solder fatigue failure.

Unfortunately, a limitation of the prior art is the expense of applying solder bumps to a chip. The solder bumps have been applied to chips by one of several methods. Coating the solder on the chip bumps by evaporation of solder metals through a mask is one such method. This method suffers from 1) long deposition times, 2) limitations on the compositions of solder that can be applied to those metals that can be readily evaporated, and 3) evaporating the metals over large areas where the solder is ultimately not wanted. Also, since most solders contain lead, a toxic metal, evaporation involves removal and disposal of excess coated lead from equipment and masks. Another common method in the prior art is electroplating of the solder onto the chip pads through a temporary sacrificial mask. Electroplating is a slow and expensive process that also deposits the solder over large areas where the solder is ultimately not wanted. Another method is to screen print solder paste on the chip pads through a stencil, then reflowing the solder to form a ball or bump on the pad. This technique is limited to bump dimensions that can be readily stencil printed, so it is not practical in bump pitches of 50 microns or less. Yet another method is to apply a thick layer of photoresist on the chip, expose through a mask, and develop to create openings through the thick photoresist to the chip pads beneath. Subsequently, the openings are filled with solder paste by printing through a stencil and then reflowing the solder to create a solder column on the chip pads. The final step is removal of the thick photoresist and reflowing the solder to create a bump or ball on the chip pads. This method allows fabrication of chips with bump pitches of 200 microns or less and is preferable to the other methods described due to its lower cost. Yet the removal of the thick photoresist from the chips after solder reflow is a cumbersome procedure that often damages the chips and the solder bumps. All these methods are generally performed prior to dicing the wafer on which the semiconductor chips are fabricated, so the application of bumps is done on many chips simultaneously.

SUMMARY OF THE INVENTION

In one aspect of the present invention there is provided a chip with underfilling encapsulant and separate discrete solder bumps pre-coated and pre-assembled on the chip for assembly to a substrate. This configuration provides a simple, cost-effective assembly procedure wherein the chip/encapsulant/discrete solder bump combination is placed on the substrate and subsequently heat is applied so that the solder is reflowed while simultaneously the encapsulant hardens, without the labor intensive underfill steps of the prior art.

In another aspect of the present invention there is provided a chip precoated with underfilling encapsulant having holes therein which expose metallized contact pads on the active surface of the chip. The holes are subsequently filled with solder paste and reflowed to create the chip/encapsulant/discrete solder bump assembly. The assembly can be placed on a substrate and subsequently, the solder is reflowed again while simultaneously the encapsulant hardens, eliminating the labor intensive underfill steps of the prior art. Alternatively, the solder paste is not reflowed at the time the holes are filled, but left in paste form until the chip/encapsulant/solder paste assembly is placed on a substrate. Subsequently, the solder is reflowed while simultaneously the encapsulant hardens. In yet another alternative approach, the chip/encapsulant/solder assembly is coated with a thin layer of a flux adhesive and, subsequently, the solder is reflowed while simultaneously the flux adhesive and encapsulant harden.

The present invention also provides a substrate precoated with the encapsulant having holes therein which expose the metallized solder pads on the substrate. The holes are subsequently filled with solder which is then hardened prior to attachment of the chip to the substrate by reflow. In another embodiment, the substrate has encapsulant and separate discrete solder columns pre-assembled thereon.

In one aspect of the present invention, there is provided a first portion of an underfilling encapsulant and separate discrete solder bumps pre-coated and pre-assembled on a chip for assembly to a substrate. The first portion of the encapsulant comprises a solid film which has been either (1) laminated to the chip in solid film form, or (2) printed on the chip in liquid form and subsequently hardened. In the first case, the film can be laminated to the chip by means of a thin layer of an adhesive or by adhesive properties intrinsic to the film itself. At least the second portion of the encapsulant comprises an adhesive material with solder fluxing properties, for example, an adhesive flux. The invention provides a simple, cost-effective assembly procedure wherein the chip/first portion of encapsulant/discrete solder bump combination is placed on the substrate/second portion of encapsulant combination and subsequently heat is applied so that the solder is reflowed while simultaneously the encapsulant cures, without the labor intensive, time-consuming underfill steps of the prior art. An advantage of the present invention is that the lower viscosity of the unfilled or lightly filled second portion during the reflow process allows the solder to flow without impediment from the hard nature of the first portion of the encapsulant.

In another aspect of the present invention, the chip/first portion of encapsulant/discrete solder bump assembly described above is coated with a thin layer of the second portion of the encapsulant. Placement of the chip, solder reflow and adhesive cure follows as described above. In this instance, the second portion comprises a liquid which is applied to the chip/first portion of encapsulant/solder bump combination or to the substrate in situ at the time they are assembled and the solder is reflowed. Alternatively, the second portion comprises a solid or viscous liquid which is applied to the chip/first portion of encapsulant/solder bump combination or to the substrate a priori, prior to the time the chip and substrate are assembled together, the second portion subsequently melting temporarily into a low viscosity liquid when the chip/first portion of encapsulant/solder bump/substrate are assembled and the solder is reflowed. This melting of the second portion provides a low-viscosity liquid at the reflow temperature of the solder so as not to impede the flow of the solder as it melts. Subsequently, the second portion hardens as previously described.

In a preferred embodiment of the present invention, the first portion of the encapsulant consists of a thick film having a reduced coefficient of thermal expansion and an increased modulus as compared to the second portion. To achieve this, the first portion comprises an encapsulant material with filler having a lower coefficient of thermal expansion and higher modulus than the encapsulant material without filler to increase the encapsulant's modulus and reduce its coefficient of thermal expansion. Alternatively, the first portion comprises an encapsulant material having an intrinsically high modulus and low coefficient of thermal expansion as compared to the second portion, such as polyimide films sold under the trade name UPILEX® and available from Oxychem, Grand Island, N.Y. Preferably, the second portion constitutes a relatively thin layer in the overall encapsulant structure which partially intermixes with the first portion during cure and has minimal effect on the reliability of the flip-chip structure, despite the second portion having generally a lower modulus and higher coefficient of thermal expansion than the first portion. The preferred invention provides a low coefficient of thermal expansion and high modulus in the first portion of the encapsulant while at the same time achieving good solder wetting and chip self-aligning in the second portion of the encapsulant. The higher modulus and lower coefficient of expansion enhance the ability of the chip/underfill/solder/substrate assembly to withstand thermal shock and extreme thermal cycles.

Yet another aspect of the present invention provides a simplified method for creating the solder bumps. In the embodiment where the first portion of the encapsulant comprises a solid film, the first portion is applied to the chip prior to the solder bumps being applied. The solid first portion is subsequently imaged and developed or drilled by lasers, plasmas, chemicals, or other methods known in the art, to create openings in the first portion exposing underlying chip pads. The openings being subsequently cleared of debris and contaminants by etching or other means known in the art, solder paste is then screen printed on the chip pads. This method is similar to the prior art method of bumping chips through a thick photoresist layer, but has the advantage of leaving the thick layer permanently attached to the chip so that it becomes part of the chip underfill encapsulant. This method also has the advantage of permitting bump pitches of 50 microns or less.

Preferably, all embodiments of the invention are applied prior to dicing the wafer or substrate on which the semiconductor chips are fabricated, so the application of the encapsualting layers and solder is done on many chips sites simultaneously.

The semiconductor chip package structures of the present invention provide, among other advantages, simple chip placement followed by reflow without labor intensive underfill steps; a solder bumped chip or substrate with an encapsulant pre-attached, with the encapsulant performing a mechanical function and the solder performing an electrical function; a low-cost method for applying the solder bumps to a flip chip or flip chip substrate by creating holes in a pre-coated or pre-laminated encapsulant; and a low-cost method for applying the solder bumps to a flip chip or substrate by creating holes in a pre-coated or pre-laminated encapsulant.

BRIEF DESCRIPTION OF THE DRAWINGS

FIG. 1 is a diagrammatic representation of a prior art underfilled flip-chip structure under expansion-induced strain at elevated temperatures.

FIG. 2 is a diagrammatic representation of a prior art underfilled flip-chip structure under contraction-induced strain at reduced temperatures.

FIG. 3 is an assembled flip-chip structure in accordance with a first embodiment of the present invention.

FIG. 4 is a diagrammatic representation of the first embodiment for forming a flip-chip structure prior to assembly.

DETAILED DESCRIPTION OF THE PREFERRED EMBODIMENTS

Figure 12:
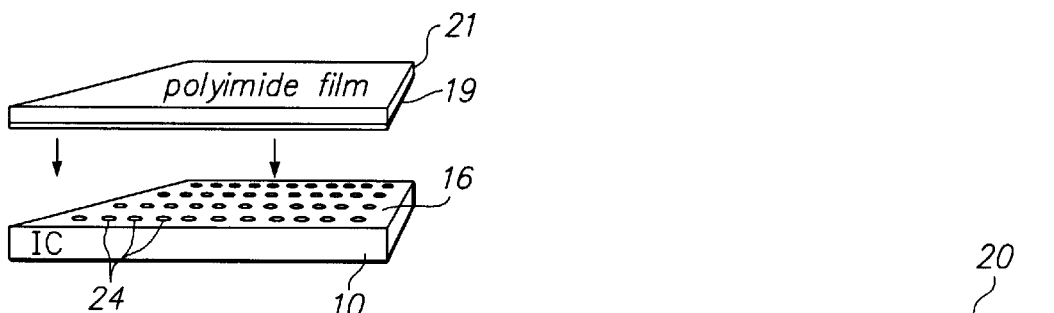
FIGS. 12 and 13 illustrate the assembly of the flip-chip structure.

Referring to FIG. 3, an integrated circuit chip 10 is shown mounted on a substrate 20. A plurality of solder pads 12 on top surface 26 of the substrate 20 are arranged to receive corresponding solder bumps 14 connected to the contact pads 24 of the chip 10. Each of the solder pads 12 is metallized so as to become solderable and electrically conductive to provide an electrical interconnection between the chip 10 and the substrate 20. With this flip-chip mounting arrangement, a gap 18 is formed around the solder bumps 14 between the top surface 26 of the substrate 20 and the bottom surface 16 of the chip 10. The gap 18 typically varies from 50 to 200 microns. The gap 18 is completely filled with an encapsulant material 22. The encapsulant material 22 is applied to the chip in either liquid form that is then hardened or in adhesive tape form, which is adhered to the chip. In one preferred embodiment of the invention, the encapsulant material 22 is a film, which has been laminated to the chip with an adhesive layer therebetween. (See FIG. 12). One preferred film, which is not meant to limit the invention but only by way of example, is a hot melt adhesive-coated polyimide tape such as SUMIOXY® ITA-5315 available from Oxychem, Grand Island, N.Y. Other types of encapsulants known to those skilled in the art are possible.

In another embodiment, the chip 10 having separate discrete solder bumps 14 pre-assembled thereon is precoated with the encapsulant material 22 prior to assembly to the substrate 20 (FIG. 4) to alleviate the underfill problems of the prior art processes and to overcome the performance limitations of substrates which are pre-coated with a homogeneous combination of adhesive material, fluxing agent and curing agent or chips which are pre-coated with a homogeneous combination of adhesive material, fluxing agent, curing agent and metal particles. The separate discrete solder bumps with encapsulant material therearound provide superior electrical performance compared to a distribution of metal particles spread throughout an encapsulating material. The encapsulating material 22 is uniformly spread across the surface 16 of the chip 10 between the solder bumps 14 covering the remainder of the chip 10. The chip 10 is then positioned so that the solder bumps 14 are facing the substrate 20 and aligned with the solder pads 12 of the substrate. In one embodiment, the solder bumps 14 protrude beyond the encapsulant after the encapsulant-coating step. In an alternate embodiment, the solder bumps 14 are covered by the encapsulant 22 wherein the encapsulant is ground, melted away, shaved off or otherwise removed to expose the solder bumps prior to attachment to the substrate. The encapsulant 22 and solder bumps 14 are moved into intimate contact with the substrate 20 and solder pads 12, respectively. The assembly is heated to cure the encapsulant 22 and reflow the solder using reflow oven technology, preferably in a nitrogen blanket to attach the solder bumps 14 to the contact pads 12 of the substrate 20. Other heating and reflow techniques, known to those skilled in the art, are possible. The encapsulant 22 provides a continuous seal between the chip 10 and the substrate 20.

Figure 5:
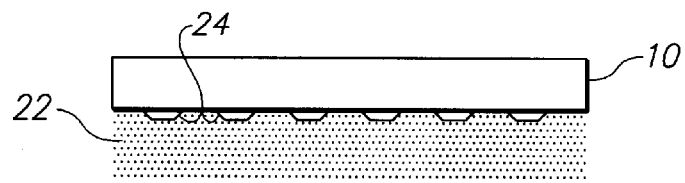
FIGS. 5–7 are diagrammatic representations of another embodiment for forming a flip-chip structure.
Figure 6:
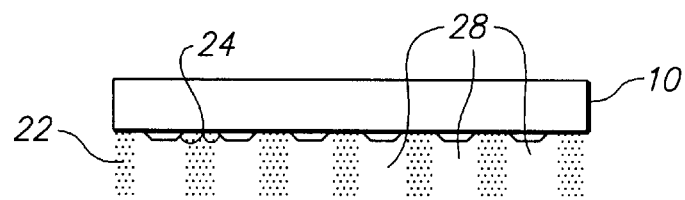
Figure 7:
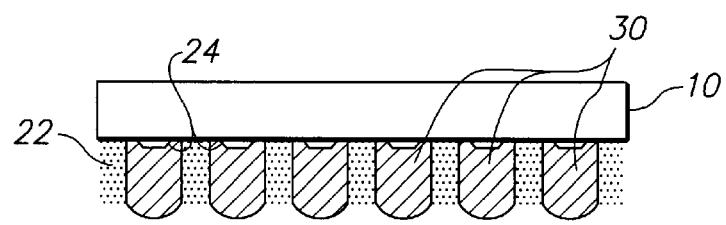
Figure 8:
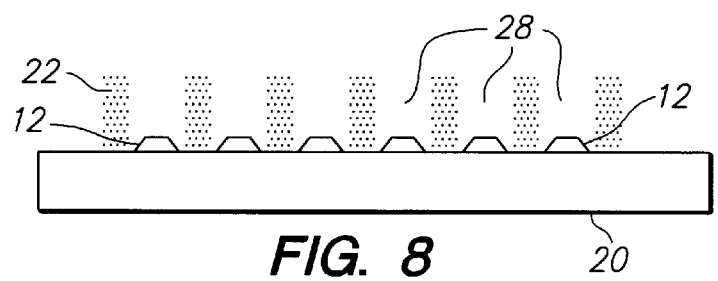
FIGS. 8 and 9 are diagrammatic representations of yet another embodiment for forming a flip-chip structure.
Figure 9:
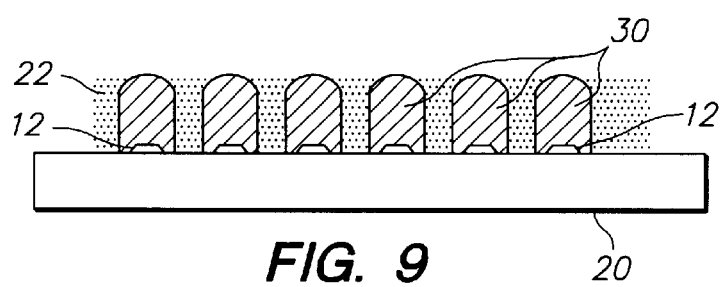
Figure 13:
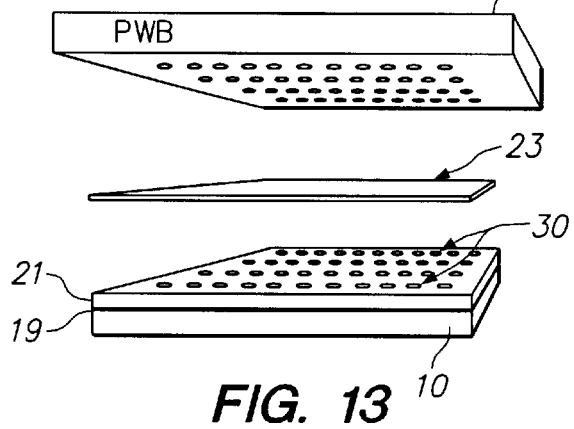

In yet another embodiment (FIG. 5), the circuitry on the bottom surface 16 of the chip 10 is coated with the encapsulant 22, comprised of an adhesive 19 (such as a high temperature thermoplastic adhesive) and a film 21 (FIG. 12), then the contact pads 24 are exposed by making vias 28 through the encapsulant 22 (e.g., either with a laser, plasma etching, chemical etching, a drill or by photo-imaging and development or any other method known to one skilled in the art) (FIG. 6). The vias 28 within the encapsulant 22 are then filled with solder 30 (FIG. 7) which is forced into the holes by solder injection molding, solder jetting, screen printing solder paste, or other methods known to those skilled in the art. With any of these embodiments, the solder 30 is reflowed to form the electrical connection between the chip and the substrate while the encapsulant 22 bonds to the substrate 20 (usually with a polymer flux layer 23. See FIG. 13) and the chip 10 to form the structural connection. As can be easily appreciated by one of ordinary skill in the art, any of the above-described embodiments can be modified by precoating the substrate 20 (rather than the chip) with the encapsulant 22 or encapsulant 22 and solder 30 combination as shown in FIGS. 8 and 9, respectively.

Figure 10:
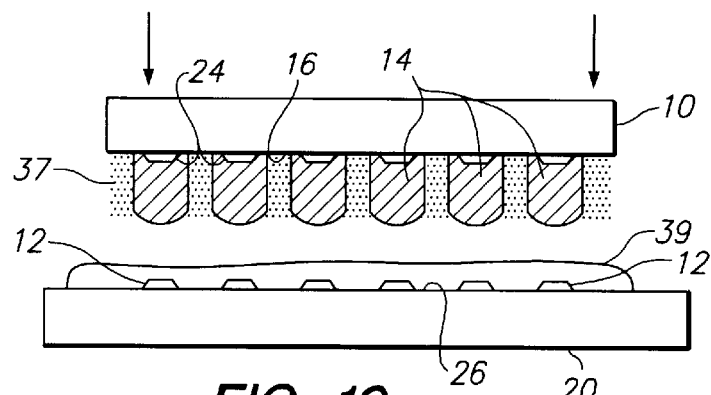
FIG. 10 is a diagrammatic representation of a flip-chip structure wherein the first portion of the encapsulant material is applied to the bumped chip and the second portion is applied to the substrate.

FIG. 10 illustrates one embodiment for forming the flip-chip package illustrated in FIG. 3 using two pre-coated portions of encapsulant. The chip 10 having separate discrete solder bumps 14 pre-assembled thereon is pre-coated with the first portion 37 of an encapsulant material 22 (FIG. 10) prior to assembly to the substrate 20. The first portion 37 comprises a film that has been laminated to the chip 10. The substrate 20, having a pattern of separate discrete solderable metal pads 12 thereon, is pre-coated with the second portion 39 of the encapsulant material prior to assembly with the chip 10. The two-layer configuration alleviates the underfill problems of the prior art processes and overcomes the performance limitations of substrates which are pre-coated with a homogeneous combination of adhesive material, fluxing agent and curing agent or chips which are pre-coated with a homogeneous combination of adhesive material, fluxing agent, curing agent and metal filler particles.

The first portion 37 (FIG. 10) which makes up part of the encapsulating material 22 (FIG. 3) extends uniformly across the surface 16 of the chip 10 between the solder bumps 14 to cover the remainder of the chip surface. The second portion 39, which makes up part of the encapsulating material 22 (FIG. 3). is spread across the surface 26 of the substrate 20 over the solderable metal pads 12 covering the chip region of the substrate 20. The chip 10 is then positioned so that the solder bumps 14 are facing the substrate 20 and aligned with the solder pads 12 of the substrate 20. The solder bumps 14 can protrude beyond the first portion 37 (as shown in FIG. 10) of the encapsulant after the encapsulant coating step of the chip 10. The encapsulant portion 37 and solder bumps 14 are moved into intimate contact with the encapsulant portion 39 and solder pads 12, respectively. The combination of portions 37 and 39 form the encapsulant 22 (FIG. 3). The assembly is heated to cure the encapsulant 22 and reflow the solder using infrared reflow technology, preferably in a nitrogen blanket to attach the solder bumps 14 to the contact pads 12 of the substrate 20. Other heating and reflow techniques, known to those skilled in the art, can be used in the present invention. The encapsulant 22 provides a continuous seal between the chip 10 and the substrate 20.

Figure 11:
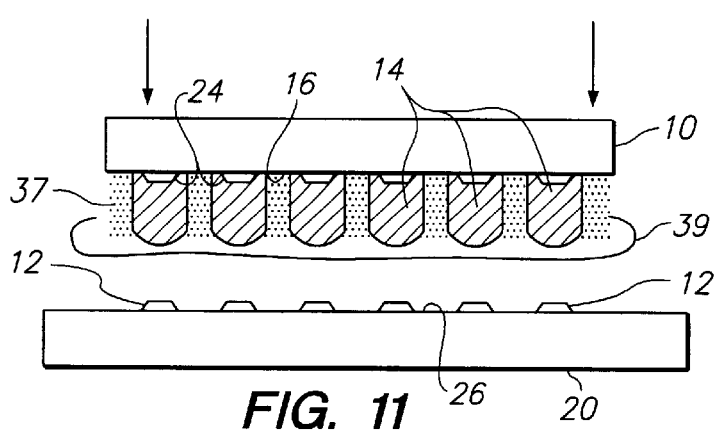
FIG. 11 is a diagrammatic representation of a flip-chip structure wherein the first portion of the encapsulant material is applied to the bumped chip and the second portion is applied over the first portion.

FIG. 11 illustrates another embodiment for forming the flip-chip package illustrated in FIG. 3 using two pre-coated discrete portions of encapsulant. The chip 10 having separate discrete solder bumps 14 pre-assembled thereon is pre-coated with the first portion 37 of an encapsulant material 22 (FIG. 3) prior to assembly to the substrate 20. The first portion 37 comprises a film which has been laminated to the chip. The first portion 37 is then pre-coated with the second portion 39 of the encapsulant material prior to assembly with the substrate 20. The first portion 37 (FIG. 11) which makes up part of the encapsulating material 22 (FIG. 3) extends uniformly across the surface 16 of the chip 10 between the solder bumps 14 to cover the remainder of the chip surface. The second portion 39 (FIG. 11) which makes up part of the encapsulating material 22 (FIG. 10) is uniformly spread over the prior applied first portion 37. The chip 10 is then positioned so that the solder bumps 14 are facing the substrate 20 and aligned with the solder pads 12 of the substrate 20 as described before. The encapsulant portions 37 and 39 and solder bumps 14 are moved into intimate contact with the substrate 20 and solder pads 12. The combination of portions 37 and 39 forms the encapsulant 22 (FIG. 3). The assembly is heated to cure the encapsulant 22 and reflow the solder as described before to attach the solder bumps 14 to the contact pads 12 of the substrate 20.

The encapsulating material of the first portion 37 can comprise a flexible film which has been laminated to the chip 10. In the preferred embodiment, in order to provide the most durable assembly, especially during severe thermal cycling, the significant properties of the first portion 37 are:

1. After cure, a coefficient of thermal expansion in the vicinity of 25 PPM/° C.;
2. After cure, a Tg above 120° C.;
3. After cure, a modulus greater than 0.1 GPa, preferably greater than 4 GPa;
4. After cure, high adhesion to the chips passivation layer that usually consists of silicon nitride, polyimide, or benzocyclobutene;
5. Solventless;
6. A chemical composition such that it does not interfere or adversely affect the properties of the second portion 39 of the encapsulant to which it will be mated; and
7. After cure, high adhesion to the second portion 39 of the encapsulant.

In general terms, the adhesive flux 39 comprises a liquid or solid composition which acts as both a primary fluxing agent and a crosslinking monomer or polymer. More specifically, the adhesive fluxes comprise the following:

A. chemical components with carboxylic acid moieties for fluxing;
B. chemical components with polymerizable moieties for crosslinking the composition;
C. a chemical or mechanical mechanism for impeding or preventing the onset of polymerization of the composition until the solder has melted and wetted all the surfaces to be soldered; and D. optional solvents, fillers, moderating agents, neutralizing agents, surfactants, modifiers, resins and other additives performing desirable functions and generally known to those skilled in the art.

A number of compositions are known in the prior art comprising these features, such as described in U.S. Pat. Nos. 5,376,403, 5,088,189, 5,136,365 and 5,128,746. A preferred composition is directed to fluxing adhesive compositions that include a fluxing agent comprising a single active component which is capable of functioning as both a primary fluxing agent and a crosslinking monomer. Generally, depending upon the intended end use, the inventive thermally curable adhesive composition comprises (a) a fluxing agent having a carboxylic acid group and one or more carbon-carbon double bonds, (b) a carboxylic acid neutralizing agent; (c) optionally, a crosslinkable diluent, (d) optionally, a free-radical initiator, and (e) optionally, a resin.

In addition the thermally curable adhesive composition may include a solvent for adjusting the viscosity. Other viscosity modifiers, thickeners and thixotropic agents may also be added. Fillers, such as silica powder, can be employed for increased modulus and lower thermal coefficient of expansion.

1. Fluxing Agents. The fluxing agent is a carboxyl containing compound that has the structure RCOOH, wherein R comprises a moiety which include two or more carbon-carbon double bonds. For high flux activity due to the presence of multiple carboxylic acids, the preferred fluxing agent is a carboxylic acid that is selected from the group consisting of compounds represented by Formulae I, II, and III, and mixtures thereof,

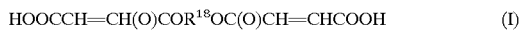

HOOCCH=CH(O)COR$^{18}$OC(O)CH=CHCOOH     (I)

R$^2$H$_2$C(HCOR″)$_n$CH$_2$OR$^3$     (II)

[X$^1$X$^2$X$^3$X$^4$]C     (III)

wherein R$^{18}$ is an alkyl having 1 to 16 carbons, preferably 1 to 9 carbons, and more preferably 1 to 3 carbons, wherein n is an integer from 1 to 16 preferably an integer from 1 to 9, and more preferably an integer from 1 to 3, wherein each of R$^1$, R$^2$, . . . R$^n$, is independently selected from —C(O)CH=CHCOOH, and H, wherein X$^1$, X$^2$, X$^3$, and X$^4$, are each independently selected from —CH$_2$OH, —CH$_2$OC(O)CH=CHCOOH, and H, with the proviso that not all of X$^1$, X$^2$, X$^3$, and X$^4$ are H, and preferably only one of said X$^1$, X$^2$, X$^3$, and X$^4$ is H.

A preferred fluxing adhesive composition that has a lower curing temperature, faster curing rate and increased moisture resistance includes a fluxing agent that has the general structure R—COOH, wherein R comprises a moiety having two or more carbon-carbon double bonds, of which preferably at least one is within an acrylate or methacrylate moiety, that is, R contains at least one acrylate (—C(O)CH=CH$_2$) or methacrylate (—C(O)C(CH$_3$)=CH$_2$) group. (Preferably, there are 1 to 5 groups.) For high flux activity due to the presence of multiple carboxylic acids, a preferred fluxing agent is a carboxylic acid that is selected from the group consisting of compounds represented by Formulae IV, V, VI and mixtures thereof,

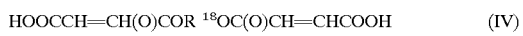

HOOCCH=CH(O)COR $^{18}$OC(O)CH=CHCOOH     (IV)

R $^2$H$_2$C(HCOR ″)$_n$CH$_2$OR$^3$     (V)

[Y$^1$Y$^2$Y$^3$Y$^4$]C     (VI)

where R$^{18}$ is a substituted alkyl moiety containing at least one acrylate or methacrylate moiety and said substituted alkyl moiety comprising a chain having 1 to 16 carbons, preferably 1 to 9 carbons, and more preferably 1 to 3 carbons, and wherein n is an integer from 1 to 16, preferably an integer from 1 to 9, and more preferably an integer from 1 to 3, wherein each of R$^1$,R$^2$, . . . R$^n$, is independently selected from —C(O)CH=CHCOOH, —C(O)CH=CH$_2$, —C(O)C(CH$_3$)=CH$_2$, and H, and wherein Y$^1$, Y$^2$, Y$^3$, and Y$^4$, are each independently selected from —CH$_2$OH, —CH$_2$OCOCH=CH$_2$, —CH$_2$OCOC(CH$_3$)=CH$_2$, —CH$_2$OC(O)CH=CHCOOH and H with the proviso that not all of Y$^1$, Y$^2$, Y$^3$, and Y$^4$ are H, and preferably not more than one of said Y$^1$, Y$^2$, Y$^3$, and Y$^4$ is H.

Incorporating an acrylate and/or methacrylate in the structure can reduce the curing temperature of the adhesive polymer since the carbon-carbon double bonds in the acrylate or methacrylate tend be more reactive than most other such double bonds. Reducing the crosslink temperature of the double bonds tends to make the adhesive flux more compatible with current practice in the field wherein solder reflow is achieved in a thermal cycle having a peak temperature of 230 C. The lower crosslink temperature can produce an adhesive flux formulation that is fully crosslinked after only one or two passes through the solder reflow thermal cycle. The acrylate and methacrylate will also tend to repel moisture and reduce the absorption of water in the cured polymer. A particularly preferred acrylate containing fluxing agent is glycidyl methacrylate which exhibits low viscosity, high flux activity and excellent curing characteristics, as further described in Example 4.

The fluxing agent typically comprises about 0.01%–100%, preferably about 5%–80%, and more preferably about 10%–70% by volume of the thermally curable adhesive composition.

The fluxing agents of the present invention exhibit flux activities that are superior to that of prior art polymer-fluxing agent mixtures. Since the inventive fluxing agents are intrinsically self-crosslinking, the thermally curable adhesive composition does not require the use of epoxy resins for crosslinking, though an epoxy may be used in the neutralizing agent. As a corollary, the shelf life or pot life of the composition is long and its flux activity high relative to conventional polymer-fluxing mixtures that include epoxy resins.

Further, the adhesion properties, mechanical integrity, and corrosion resistance achieved with the fluxing agents are superior to those achieved with prior art polymer fluxing agents because there is no need to add aggressive fluxing activators. The inventive fluxing agents are fully crosslinked and all components thereof are chemically immobilized upon curing. Even the reaction by-products of flux deoxidization of the metals may be chemically bound in the polymer matrix.

Carboxylic acids function well as fluxing agents to remove oxides from metals. In addition, carboxylic acids are also very effective crosslinking moieties when present in their reactive form in a fluxing composition containing a suitable thermosetting resin, such as an epoxy. For this reason, in the prior art, chemical protection of the carboxylic acid was essential to achieving stability and preventing premature reactions. Protection was achieved by binding the fluxing agent with a chemically- or thermally-triggered species so that it becomes reactive only at or near the time that the solder melts. However, with the present invention, no such protection is necessary because the compositions can be formulated with only minimal amounts of components that can crosslink with the carboxylic acid moiety. This results in a fluxing agent that can function at near its full strength with the metal oxides to produce fluxing that is superior to any heretofore polymerizable fluxing agent. The flux activity of the inventive fluxing agent in some applications may be too high thereby requiring dilution of the fluxing agent to prevent formation of undesirable gaseous by-products.

With the inventive fluxing agent, the principal crosslinking mechanism occurs at the carbon-carbon double bonds existing in the fluxing agent molecule and not at the carboxylic acid groups. The carboxylic acids do not react with the double bonds, therefore on its own, in the absence of other molecules that can react with the carboxylic acid, the fluxing agent does not polymerize at ambient temperatures. It is at elevated temperatures that the double bonds begin to open and react with other opened double bonds to crosslink. Since each fluxing agent molecule contains at least two double bonds, the molecules crosslink into polymeric networks.

By reducing or eliminating the need for a separate thermosetting resin in the flux composition, as is required in the prior art, the flux activity can be kept very high without concern about pre-maturely crosslinking the thermosetting resin. By crosslinking the fluxing agent itself, an adhesive having a higher glass transition temperature and lower coefficient of thermal expansion can be created without sacrificing fluxing activity.

Another preferred fluxing-adhesive composition, one that has very high moisture resistance, comprises a fluxing agent with the general structure R—COOH, wherein R comprises a moiety having two or more carbon-carbon double bonds, of which preferably at least one is within an acrylate or methacrylate moiety and R further contains at least one aromatic moiety, which is an unsaturated aromatic carbocylic group having a single ring (e.g., phenyl) or multiple condensed rings (e.g., naphthyl) which condensed rings may or may not be aromatic. The aromatic moiety also includes substituted aromatic moieties. The R group can also be fluorinated. For high flux activity due to the presence of multiple carboxylic acids, the preferred fluxing agent is a carboxylic acid that is selected from the group consisting of compounds represented by Formulae VII and mixtures thereof. A particularly preferred aromatic-containing fluxing agent is one made from bisphenol A epoxy, as described in Example 1, which exhibits significant hydrophobicity.

The generalized structure for carboxylic acids containing two or more carbon-carbon double bonds and also containing aromatic moieties is:

$$R^{19}—Ar—R^{20} \quad (VII)$$

in which Ar is

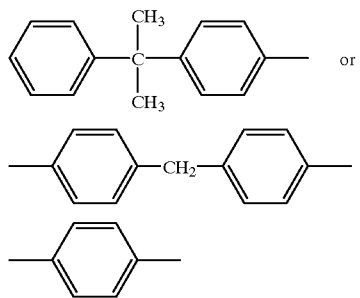

and $R^{19}$ and $R^{20}$ are

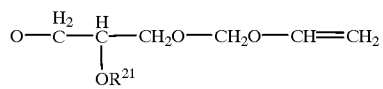

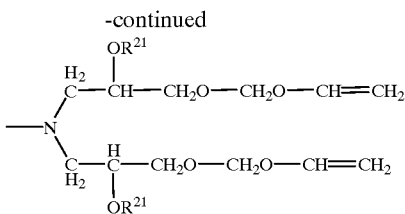

in which $R^{21}$ is —C(O)CH=CH—COOH, —C(O)CF$_2$CF$_2$CF$_2$COOH, or H.

2. Carboxylic Acid Neutralizing Agent. The carboxylic acid neutralizing agent is a compound that has the structure $R^1$—X—$R^2$, wherein X comprises a carboxylic-neutralizing moiety such as, for example, epoxide, —NH— or —CH(OH)— group and wherein $R^1$ and $R^2$ are independently selected from (i) H, (ii) alkyl or alkylene moiety having 1 to 18 carbons, preferably 1 to 9 carbons, and more preferably 1 to 3 carbons, and (iii) aromatic moiety which is an unsaturated aromatic carbocylic group having a single ring (e.g., phenyl) or multiple condensed rings (e.g., naphthyl) which condensed rings may or may not be aromatic. The neutralizing agent may also be a compound containing isocyanate or cyanate ester groups, or any other group that can react with the carboxylic acid. The aromatic moiety also includes substituted aromatic moieties. The alkyl, alkylene, or aromatic moieties can include one or more carbon-carbon double bonds and/or one or more of X groups. To neutralize the carboxylic acids without the formation of condensation by-products, the preferred neutralizing agent is an epoxide that is selected from the group consisting of compounds represented by Formulae VIII, IX, and X, and mixtures thereof,

 (VIII)

 (IX)

 (X)

wherein $R^1$ and $R^2$ are defined above and $R^4$ is preferably selected an alkyl, alkylene, or aromatic group. Preferably $R^1$, $R^2$, and $R^4$ is selected from:

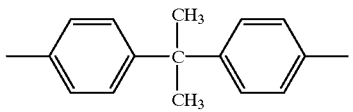

and 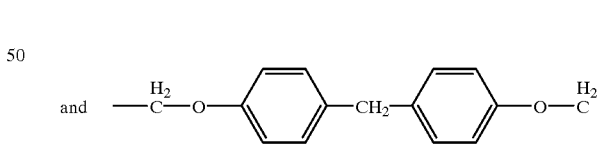

Another preferred neutralizing agent has the general structure H(CHOCH)$R^5$, wherein $R^5$ comprises a moiety having one or more carbon-carbon double bonds, of which preferably at least one is contained in an acrylate or methacrylate moiety, that is, $R^5$ contains at least one acrylate (—C(O)CH=CH$_2$) or methacrylate (—C(O)C(CH$_3$)=CH$_2$) group. (Preferably, there are 1 to 5 groups, for example, glycidyl methacrylate; 1,2-epoxy-7-octene; and 1,2-epoxy-9-decene.)

In the process of neutralizing the carboxylic acid of the fluxing agent, the neutralizing agent becomes incorporated, i.e., crosslinked, into the cured adhesive composition. Furthermore, incorporation an acrylate and/or methacrylate in the structure of the carboxylic neutralizing agent will also to reduce the curing temperature of the adhesive polymer since the carbon-carbon double bonds in the acrylate or methacrylate tend to be more reactive than most other such double bonds. Reducing the crosslink temperature of the double bonds tends to make the adhesive flux more compatible with current practice in the field wherein solder reflow is achieved in a thermal cycle having a peak temperature of 230 C. The lower crosslink temperature can produce an adhesive flux formulation that is fully crosslinked after only one or two passes through the solder reflow thermal cycle. The acrylate and methacrylate will also tend to repel moisture and reduce the absorption of water in the cured polymer. A particularly preferred acrylate containing neutralizing agent is glycidyl methacrylate which exhibits low viscosity and high flux activity as further described in Example 4.

The amount of neutralizing agent employed is preferably proportional to the amount of fluxing agent present and the neutralizing agent typically comprise about 0.01%–90% preferably about 5%–50%, and most preferably about 10%–50% by volume of the thermally adhesive composition. Preferably, no more than a stoichiometric amount (with the carboxylic acid prior to fluxing reactions) is employed to neutralize the carboxylic acid in the fluxing agent. Thermally curable adhesive compositions where the amount of neutralizing agent is substantially higher than the required stoichiometric amount will generally exhibit inferior fluxing properties, whereas compositions with substantially less than stoichiometric amounts of neutralizing agent will generally exhibit poor electrical insulation and high metallic electromigration when exposed to humid environments.

Since the neutralizing agents are chemically linked with the carboxylic acid in the fluxing agent only slowly and at elevated temperatures, they reduce the fluxing activity of the adhesive flux minimally. As a corollary, the shelf life or pot life of the composition is long and its flux activity high relative to conventional polymer-fluxing mixtures that require epoxy resins.

With the inventive fluxing agent, the principal crosslinking mechanism still occurs at the carbon-carbon double bonds existing in the fluxing agent molecule and not at the carboxylic acid groups.

3. Diluents. The presence of carbon-carbon double bond (s) in the fluxing agent molecule allows much flexibility in the formulation of a flux composition with exceptional thermomechanical properties. This is achieved by the addition of double bond containing diluents that can also crosslink with the flux to create a superior adhesive. This technique permits the design of fluxing adhesive compositions that can attain high crosslink densities, which are desirable for good thermomechanical properties and good adhesion. Moreover, this is accomplished without the concern of premature crosslinking and reduced pot life associated with the prior art. Preferred diluents include, for example, (a) penta eryethritol tetraacrylate, C(CH$_2$OOCCH=CH$_2$)$_4$, (b) triallyl-1,3,5-triazine-2,4,6 (1H,3H, 5H)-trione, (c) tris[$^2$-(acryloxy)ethyl]isocyanurate, (d) glycerol propoxylate triacrylate and mixtures thereof. Diluents (b) and (c) have the following structures:

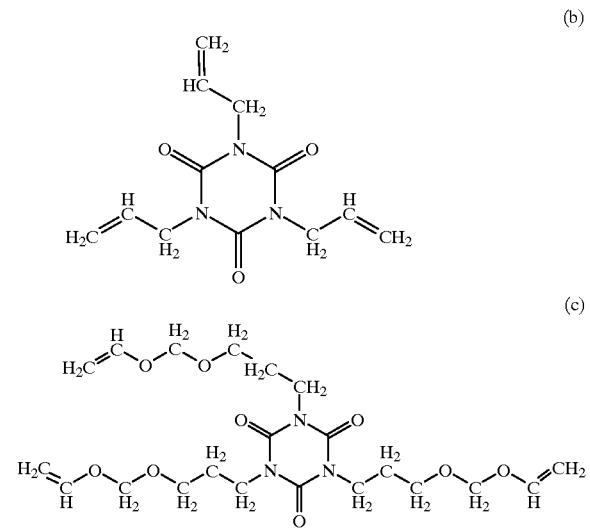

Other double bond compounds, many of which are commercially available, including, for example, diallyl phthalate and divinyl benzene can also be used. Hydrophobic diluents as described are preferred but hydrophilic diluents can also be employed when appropriate. The diluent when employed typically can comprise up to about 90%, preferably between about 5%–80%, and more preferably between about 50%–80% by volume of the thermally curable adhesive composition.

One benefit of employing hydrophobic diluents is that their presence tends to reduce the amount of water which the cured adhesive composition will absorb. The reason is that the fluxing agent, when crosslinked, will have active carboxylic groups that can attract water, even though these carboxylic groups, being part of a network, are immobile. Water acts as a plasticizer which softens the cured adhesive composition. The use of hydrophobic diluents which are crosslinked to the fluxing agent will counteract the hydrophilic effects of the carboxylic acid groups. Indeed, the cured adhesive compositions containing hydrophobic diluents can have less than 2% (wt) moisture when exposed to ambient conditions.

4. Free Radical Initiators. While the thermally curable adhesive composition can be cured using heat alone, the cross linking reaction can be initiated and facilitated by the presence of free-radicals, including, for example, those generated by benzoyl peroxide, butyl hydroperoxide, 2,2'-azobisisobutyronitrile, and mixtures thereof. These free radical initiators or sources are commercially available.

Free-radicals can be created in-situ by exposure of the free-radical initiator to heat, radiation, or other conventional energizing sources. Introduction of an appropriate free-radical initiator can accelerate the onset of crosslinking to the desired moment in a solder reflow operation. The presence of a small amount of free-radical crosslinking initiator in the fluxing agent can be used to control the rate and the temperature of crosslinking of the fluxing agent, ensuring effective fluxing action and strong adhesion of the fluxing agent to the substrates upon curing.

The free radical initiator when employed typically comprises up to about 5%, preferably between about 0%–3%, and more preferably about 0.3%–1% by weight of the thermally curable adhesive composition.

5. Resins. The thermally curable adhesive composition does not require resins; further, compositions that do not include resins tend to have longer pot lives and lower viscosities during solder reflow. However, as an option, a resin can be employed and it functions to increase the adhesion of the cured composition to the substrate and to increase the cohesive strength and glass transition temperature of the cured composition. The resin may be any suitable resin that is compatible (i.e., blendable) with the fluxing agent. By blendable is meant that the resins do not have to be chemically bonded to the fluxing agent and/or diluent. Resins which meet these requirements include, but are not limited to, epoxies, phenolics, novalacs (both phenolic and cresolic), polyurethanes, polyimides, bismaleimides, maleimides, cyanate esters, polyvinyl alcohols, polyesters, and polyureas. Preferred resins 1,4-cyclohexanedimethanol diglycidyl ether, 3,4-epoxycyclohexylmethyl 3,4-epoxycyclohexanecarboxylate, N,N-diglycidyl-4-glycidyl-oxyanilline, bisphenol A based epoxy resins, and mixtures thereof. These are commercially available.

Suitable compounds (including polymers) can also be modified to form resins that are blendable with the diluent and/or the carboxylic acid fluxing agent. Examples of such compounds are acrylics, rubbers (butyl, nitrile, etc.), polyamides, polyacrylates, polyethers, polysulfones, polyethylenes, polypropylenes, polysiloxanes, polyvinyl acetates/polyvinyl esters, polyolefins, cyanoacrylates, and polystyrenes. Generally, any compound can function as a resin if it can be modified to contain at least one of the following illustrative functional groups that act as reactive sites for polymerization: anhydrides, carboxylic acids, amides, amines, alcohols/phenols, nitriles, carbamates, isocyanates, sulfonamides, semicarbazones, oximes, hydrazones, cyanohydrins, ureas, phosphoric esters/acids, thiophosphoric esters/acids, phosphonic esters/acids, phosphites, phosphonamides, and sulfonic esters/acids. For example, a polyolefin which has no reactive sites for binding and has poor adhesive properties is typically not a suitable resin, however, a carboxylated polyolefin functions well when matched with a suitable crosslinking agent. A combination of these and other resins, such as non-crosslinkable thermoplastic resins, may also be used as resins. Resins when employed can comprise up to about 80%, preferably between about 10%–80%, and more preferably about 60%–70% by volume of the thermally curable adhesive composition.

In preparing the fluxing composition, the proportions of the five components may be varied over a considerable range and still yield acceptable fluxing activity as well as good post cured material properties. Preferably, the fluxing composition employed does not produce gaseous byproducts that can result in the formation of bubbles in the final cured composition. This can be achieved with thermally curable adhesive compositions preferably formulated as follows:

a) Fluxing agent comprising about 5%–80% (vol.) of the composition;
b) Neutralizing agent comprising about 0.1–90% (vol.) of the composition;
c) Diluent comprising about 5%–80% (vol.) of the composition;
d) Free radical initiator comprising about 0%–3% (wt) of the composition; and
e) Resin comprising about 0%–80% (vol.) of the composition.

It should be noted that some neutralizing agents can also function as resins. Therefore, when resins are employed, the amount can be kept to a minimum. Some thermally curable adhesive compositions having components within these ranges may exhibit undesirably high moisture absorption, low glass transition temperatures, or high coefficients of thermal expansions after cured, but they remain useful as fluxing compositions in applications where these characteristics are not critical.

Most preferably, the thermally curable adhesive composition after being cured has a coefficient of thermal expansion of about 25 PPM/° C., a glass transition temperature in excess of 150° C., electrical insulation resistance greater that 100 MegOhms according to IPC-TM-650 testing on the IPC-B-24 test board and moisture content of less than 2%. These characteristics can be achieved with thermally curable adhesive compositions preferably comprising about 5%–35% (vol.) fluxing agent, a stoichiometric quantity of neutralizing agent and about 20%–80% (vol.) diluent.

While, again, some of the fluxing agents within these ranges may exhibit high coefficient of thermal expansion or low glass transition temperature when cured, they remain useful as fluxes in applications where these characteristics are not critical.

In order for the thermally curable adhesive composition to achieve the largest spreading and wetting by the solder, it must achieve and maintain low viscosity up to the temperature at which the solder melts and wets the metallizations. If the composition becomes too thick before the solder has melted, it will impede the flow of the solder melt and reduce the degree of metal soldering. For this reason, the curing of the composition must occur slowly relative to the time required to reach the melting point of the solder powder. This can be achieved by selection of the components with appropriate crosslinking temperatures and formulating the appropriate proportions by use of a differential scanning calorimeter to control reaction rates and times.

The inventive thermally curable composition exhibit the following features:

a) provides sufficient flux activity to promote the solder bump to readily wet the metallization on the substrate during solder reflow, without the presence of corrosive flux activators that can contaminate the silicon chip;

b) promotes solder wetting and self-alignment of the chip to the pads on the substrate by action of the wetting force of the molten solder, during the solder reflow cycle, no curing of the flux composition occurs until the solder bump has been melted;

c) reduces or eliminates gaseous evolution during the reflow cycle that would otherwise create voids;

d) cures quickly and soon after solder bump melts;

e) demonstrates little shrinkage of the composition during curing to minimize the stress resulting from the curing process and subsequent cooling; and f) forms strong adhesion of the cured composition to the chip, substrate and solder joints.

SYNTHESIS OF FLUXING AGENTS

EXAMPLE 1

Preparation of Bisphenol A Glycerolate di(2-octen-1-ylsuccinic) Acid Monoester 10.54 g of bisphenol A diglycidyl ether was heated to 70 C. under stirring and then 4.46 g acrylic acid was added slowly under nitrogen atmosphere. After maintaining the reaction at 70 C. for 2 hours, 13.0 g of 2-octen-1-ylsuccinic anhydride was added and then the temperature was raised to 80 C. under mechanical stirring. The reactants are stirred at 80 C. for 2–3 hours to complete the reaction.

The reactions involved in this synthesis include:

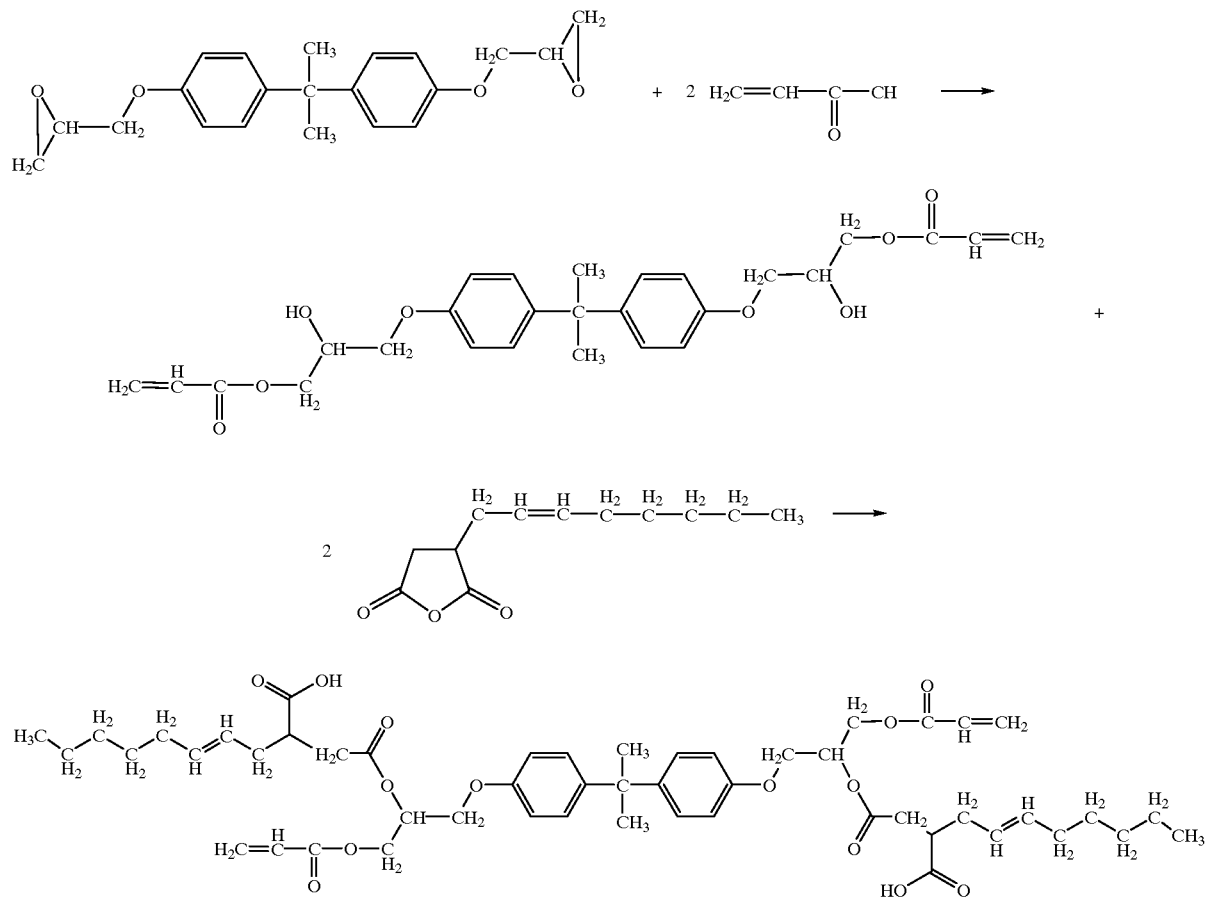

EXAMPLE 2

Preparation of Bisphenol A Diglycerolate Dimaleic Acid Monoester 34,8 g of bishenol A diglycidyl ether was heated to 70 C. under continuous stirring and then 14.4 g of acrylic acid was added slowly under nitrogen atmosphere. After maintaining the reaction at 70 C. for 2 hours, 19.6 g of maleic anhydride was added and then the temperature was raised to 80 C. under mechanical stirring for 2–3 hours to complete the reaction.

The reaction involved in this synthesis is:

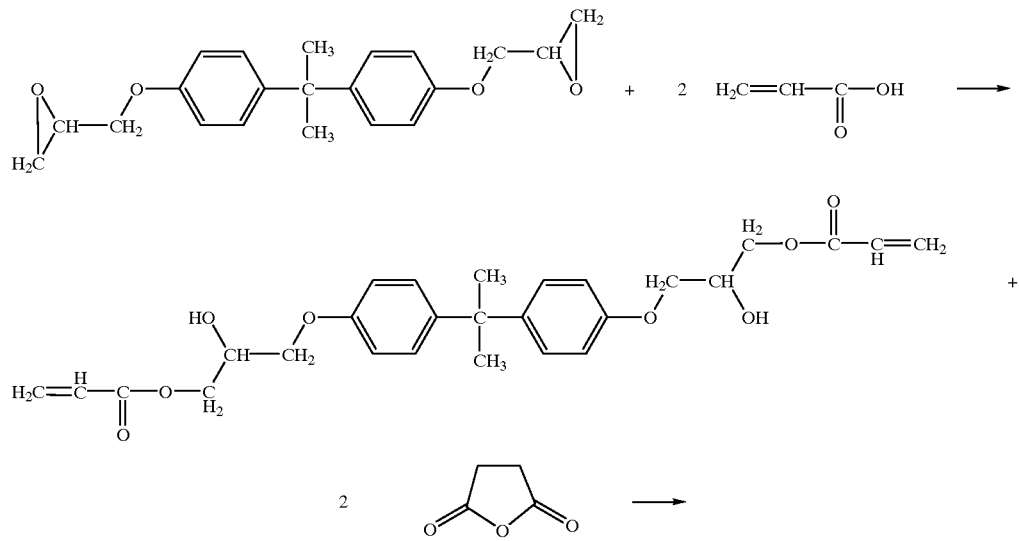

-continued

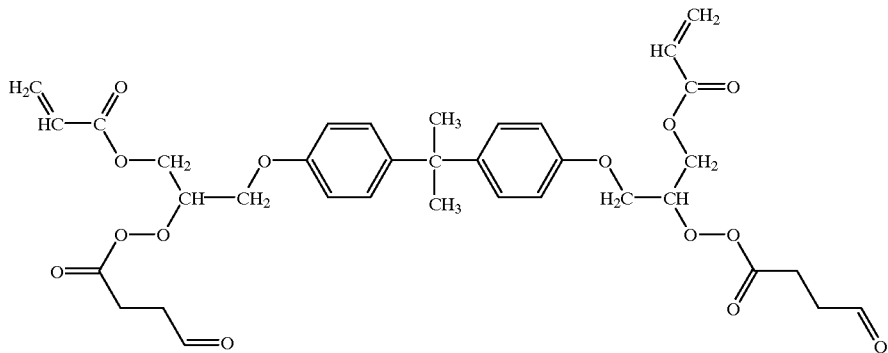

EXAMPLE 3

Synthesis of Pentaerythritol Triacrylate Maleic Acid Monoester 9.8 g of maleic anhydride was heated to 80 C. under nitrogen atmosphere until all the maleic anhydride is melted before 29.8 g of pentaerythritol triacrylate was added slowly under continuous stirring. The reaction was then maintained at 80 C. for 3 hours followed by cooling to room temperature.

The reaction involved in this synthesis is:

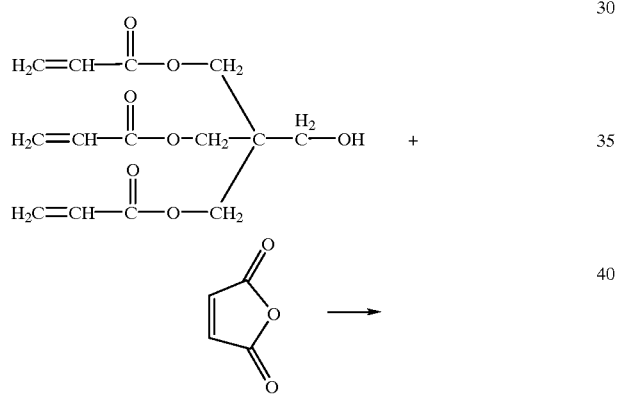

-continued

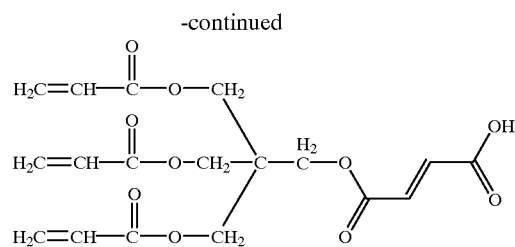

EXAMPLE 4

Formulation of Fluxing Adhesive

Stoichiometric amounts of glycidyl methacrylate was added to the flux agent to neutralize the carboxyl groups. 24.6 g of glycidyl methacrylate was added to 75.4 g of bisphenol A glycerolate di(2-octen-1-ylsuccinic) acid monoester and the mixture was thoroughly stirred at 60 C. for 10 min. The reaction that occurs after reflow is:

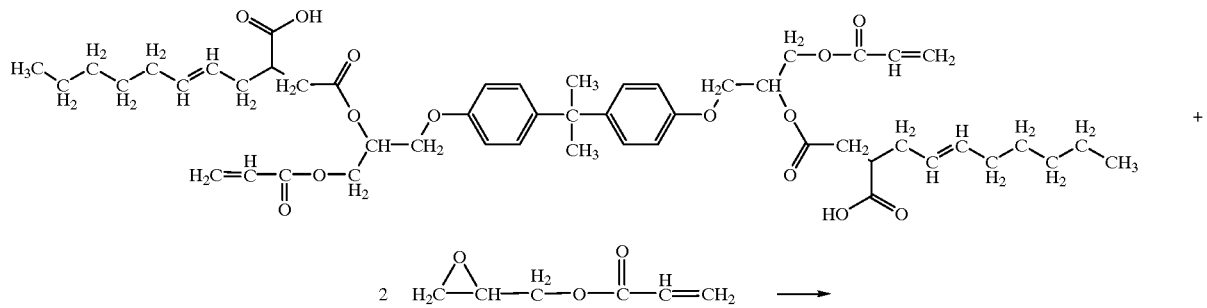

-continued

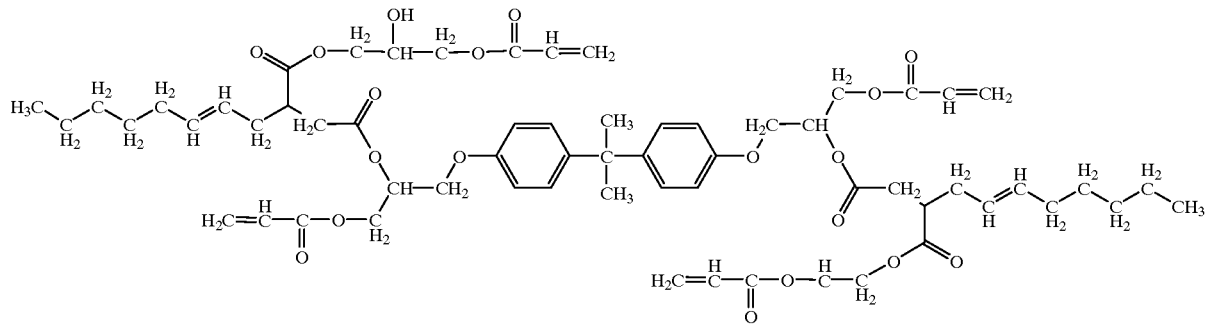

EXAMPLE 5

Formulation of Fluxing Adhesive

Stoichiometric amounts of bisphenol A based epoxy was added to the flux agent to neutralize the carboxyl groups. 30.3 g bisphenol A based epoxy was added to 71.5 g bisphenol A glycerolate di(2-octen-1-ylsuccinic) acid monoester and the mixture was thoroughly stirred at 60 C. for 10 min. The reaction that occurs after reflow is:

EXAMPLE 8

Formulation of Fluxing Adhesive 21.6 g glycidyl methacrylate and 10 g pentaerythritol tetraacrylate was added to 68.4 g bisphenol A glycerolate dimaleic acid monoester and the mixture was thoroughly stirred at 60 C. for 10 min. The mixture was cooled to room temperature for use.

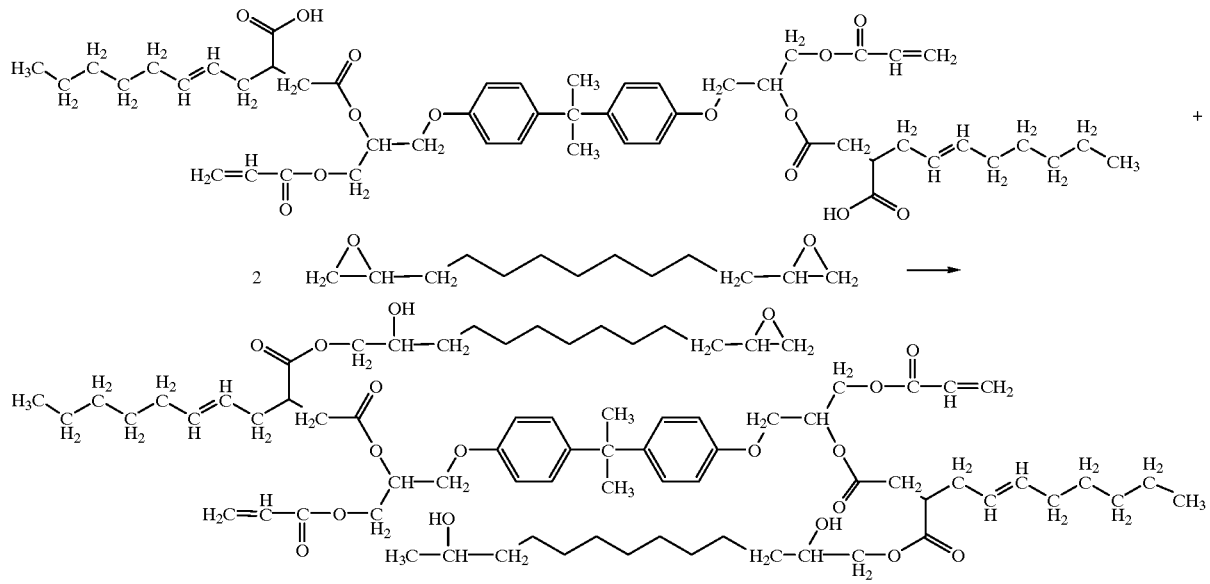

EXAMPLE 6

Formulation of Fluxing Adhesive 15.3 g bisphenol A based epoxy and 10 g glycidyl methacrylate was added to 74.5 g bisphenol A glycerolate di(2-octen-1-ylsuccinic) acid monoester and the mixture was thoroughly stirred at 60 C. for 10 min. Then the mixture was cooled to room temperature for use.

EXAMPLE 7

Formulation of Fluxing Adhesive 21.6 g glycidyl methacrylate and 10 g pentaerythritol tetraacrylate was added to 68.4 g bisphenol A glycerolate di(2-octen-1-ylsuccinic) acid monoester and the mixture was thoroughly stirred at 60 C. for 10 min. The mixture was cooled to room temperature for use.

EXAMPLE 9

The inventive compositions were formulated as follows:

| Fluxing Agent | % Fluxing Agent in Composition Number: | | | | | |
|---|---|---|---|---|---|---|
| | 1 | 2 | 3 | 4 | 5 | 6 |
| bisphenol A glycerolate di(2-octen-1-ylsuccinic) acid monoester | 100 | 70 | 75 | 75 | 60 | 65 |
| bisphenol A diglycidyl ether | — | 30 | — | 15 | 40 | 25 |
| glycidyl methacrylate | — | — | 25 | 10 | — | — |
| pentaerythritol tetraacrylate | — | — | — | — | — | 10 |

Physical characteristics of the inventive curable adhesive compositions were measured. The results are set forth in the following table. SIR is surface insulation resistance.

| Composition | Solder Spread (Area) | Glass Transition Temperature Tg (C.) | Thermal Degradation Temperature (C.) | SIR (Ohms) (85 C., 85% RH after 168 Hrs.) | Shear strength for gold surface (MPa) | Shear strength after 110 Hrs. humidity (85 C., 85% RH) |
|---|---|---|---|---|---|---|
| A | 1.28 | — | — | — | — | — |
| 1 | 3.80 | >200 | >350 | 2.28E8 | 20.57 | — |
| 2 | 3.45 | >200 | >270 | 2.35E8 | 30.16 | — |
| 3 | 3.62 | >200 | >300 | 2.42E8 | 22.31 | 36.31 |
| 4 | 3.56 | >200 | >320 | 2.30E8 | 33.84 | 35.42 |
| 5 | 3.27 | >200 | >290 | 2.46E8 | 32.94 | 44.86 |
| 6 | 3.25 | >200 | >300 | 2.25E8 | 28.62 | 32.58 |

Composition A consisted of an adhesive material that is described in U.S. Pat. No. 5,128,746 (Example 4) which contains a fluxing agent and hardener. The composition on was prepared with the following components (by weight): 50% Shell EPON 825 epoxy resin (Shell Chemical Co.), 7% malic acid, 42% methylhexahydrophthalic anhydride (MA) and 1% imidazole. The malic acid and the epoxy resin were mixed and heated to about 150 C. with stirring until the solution was clear. The solution was allowed to cool to room temperature before the MA and imidazole were added and the mixture was stirred until uniform.

As is apparent, the inventive compositions yield superior physical properties. The solder spread was measured by placing a ball of solder on a surface and then applying a small amount of the curable adhesive composition (or composition A) to the solder. The surface was then heated to about 200 C. and the area that the melted solder covered was measured. The solder spread values are normalized, that is, the solder spread in the case where no fluxing agent was employed is equal to 1.

The surface insulation resistance (SIR) test was performed according to the IPC-TM-650 test method and using the IPC-B-24 test board, both available from the IPC, Lincolnwood, Ill. The test was conducted at 85 C and 20% relative humidity at the start. The chamber is stabilized under these conditions for 3 hours, then the humidity is slowly increased to 85% over a 15 minute period and the specimens were allowed to come to equilibrium for at least 1 hour before applying a bias voltage. The bias voltage for this test is 50 v. The test voltage is −100 v. Insulation resistance is measured at the start and at 168 hours. Using this test method, all the formulations listed above exhibited significantly lower insulation resistance values if prepared without a carboxylic acid neutralizing agent. Many test boards made with the above formulations, but without the neutralizing agent exhibited electromigration.

It will now be apparent to those skilled in the art that various modifications, variations, substitutions, and equivalents exist for various elements of the invention but which do not materially depart from the spirit and scope of the invention. Accordingly, it is expressly intended that all such modifications, variations, substitutions and equivalents which fall within the spirit and scope of the invention as defined by the appended claims be embraced thereby.

We claim:

1. An electrical component assembly, comprising:
   (a) a substrate having a plurality of pads on a first surface thereof;
   (b) an integrated circuit chip having an encapsulant on an active surface thereof, the encapsulant comprising a first encapsulant portion laminated film having a plurality of holes there through filled with an electrically conductive material that extends from contacts on the active surface aligned with the holes through the encapsulant to the plurality of pads on the substrate; and
   (c) a second encapsulant portion of flux adhesive between the substrate and a subassembly comprising the encapsulant and the electrically conductive material.

2. The electrical component assembly of claim 1 wherein the electrically conductive material in the plurality of holes comprises solder.

3. The electrical component assembly of claim 1 wherein the first portion of the encapsulant and the electrically conductive material are located on the integrated circuit chip and the second portion is located on the substrate.

4. The electrical component assembly of claim 3 wherein the first portion comprises a polymeric adhesive and a filler.

5. The electrical component assembly of claim 1 wherein the first portion of the encapsulant and the electrically conductive material are located on the integrated circuit chip and the second portion is coated on the first portion.

6. The electrical component assembly of claim 1 wherein the encapsulant includes a polymer layer that can be remelted after assembly of the electrical component assembly to allow removal of the integrated circuit chip for repair or replacement.

7. The electrical component assembly of claim 1 wherein the encapsulant includes a printed circuit layer having electrical circuitry thereon.

8. An electrical component assembly, comprising:
   (a) a substrate having a plurality of pads on a first surface thereof; and
   (b) an integrated circuit chip having an encapsulant on an active surface thereof, the encapsulant having a plurality of holes therethrough filled with an electrically conductive material that extends from contacts on the active surface aligned with the holes through the encapsulant to the plurality of pads on the substrate, wherein a first portion of the encapsulant and the electrically conductive material are located on the integrated circuit chip and a second portion is located on the substrate, the first portion comprising a first encapsulant portion laminated film and the second portion comprises a flux adhesive.

9. The electrical component assembly of claim 8 wherein the electrically conductive material in the plurality of holes comprises solder.

10. The electrical component assembly of claim 8 wherein the first portion comprises a polymeric adhesive and a filler.

11. The electrical component assembly of claim 8 wherein the first portion of the encapsulant and the electrically conductive material are located on the integrated circuit chip and the second portion is coated on the first portion.

12. The electrical component assembly of claim 8 wherein the encapsulant includes a polymer layer that can be remelted after assembly of the electrical component assembly to allow removal of the integrated circuit chip for repair or replacement.

13. The electrical component assembly of claim 8 wherein the encapsulant includes a printed circuit layer having electrical circuitry thereon.

14. An electrical component assembly, comprising:
   (a) a substrate having a plurality of pads on a first surface thereof; and
   (b) an integrated circuit chip having an encapsulant on an active surface thereof, the encapsulant having a plurality of holes therethrough filled with an electrically conductive material that extends from contacts on the active surface aligned with the holes through the encapsulant to the plurality of pads on the substrate, and wherein the encapsulant includes a first portion comprising a printed circuit layer having electrical circuitry thereon and the first portion comprises a laminated film.

15. The electrical component assembly of claim 14 wherein the electrically conductive material in the plurality of holes comprises solder.

16. The electrical component assembly of claim 14 further comprising a second portion of flux adhesive between a subassembly comprising the encapsulant, the electrically conductive material, and the substrate.

17. The electrical component assembly of claim 14 wherein the first portion comprises a polymeric adhesive and a filler.

18. The electrical component assembly of claim 14 wherein the first portion of the encapsulant and the electrically conductive material are located on the integrated circuit chip and the second portion is located on the substrate.

19. The electrical component assembly of claim 18 wherein the second portion comprises an adhesive material with solder fluxing properties.

20. The electrical component assembly of claim 14 wherein the first portion of the encapsulant and the electrically conductive material are located on the integrated circuit chip and the second portion is coated on the first portion.

21. The electrical component assembly of claim 14 wherein the encapsulant includes a polymer layer that can be remelted after assembly of the electrical component assembly to allow removal of the integrated circuit chip for repair or replacement.

22. An electrical component assembly, comprising:
   (a) an integrated circuit chip having a plurality of pads on an active surface thereof; and
   (b) a substrate having an encapsulant on a first surface thereof, the encapsulant having a plurality of holes therethrough filled with an electrically conductive material that extends from contacts on the first surface aligned with the holes through the encapsulant to the plurality of pads on the integrated circuit chip, wherein a first portion of the encapsulant and the electrically conductive material are located on the substrate and a second portion is located on the integrated circuit chip, the first portion comprises a laminated film and the second portion comprises an adhesive flux.

23. The electrical component assembly of claim 22 wherein the electrically conductive material in the plurality of holes comprises solder.

24. The electrical component assembly of claim 22 wherein the first portion comprises a polymeric adhesive and a filler.

25. The electrical component assembly of claim 22 wherein the first portion of the encapsulant and the electrically conductive material are located on the substrate and the second portion is coated on the first portion.

26. The electrical component assembly of claim 22 wherein the encapsulant includes a polymer layer that can be remelted after assembly of the electrical component assembly to allow removal of the integrated circuit chip for repair or replacement.

27. The electrical component assembly of claim 22 wherein the encapsulant includes a printed circuit layer having electrical circuitry thereon.

28. An integrated circuit assembly comprising:
   (a) at least one integrated circuit device having an active surface with a plurality of separate discrete solderable contacts thereon;
   (b) a plurality of discrete solder bumps positioned on the active surface of the integrated circuit device such that one or more of the solderable contacts has a solder bump associated with it, said solder bumps electrically interconnected with its associated contact pad; and
   (c) an encapsulant comprising at least two portions wherein
      (i) a first portion comprises a laminated film; and
      (ii) a second portion comprises an adhesive flux.

29. The integrated circuit assembly of claim 28 wherein the first portion comprises a polymer and an inorganic filler.

30. The integrated circuit assembly of claim 28 wherein the second portion encapsulant contains little or no filler.

31. The integrated circuit assembly of claim 28 wherein the first portion covers at least a portion of the surface of the integrated circuit device and lies between the solder bumps.

32. The integrated circuit assembly of claim 28 wherein the solder bumps protrude beyond the first portion.

33. The integrated circuit assembly of claim 28 wherein the encapsulant comprises at least one portion that can be remelted sufficiently to allow removal of the device after it has been assembled to the substrate.

34. The electrical component assembly of claim 28 wherein the encapsulant includes a printed circuit layer having electrical circuitry thereon.

35. The integrated circuit assembly of claim 28 wherein the second portion comprises an adhesive flux encapsulant comprising carboxylic acid moieties for fluxing and polymerizable moieties for crosslinking.

* * * * *